United States Patent
Lesso

(10) Patent No.: US 11,134,324 B2
(45) Date of Patent: Sep. 28, 2021

(54) MICROPHONE DEVICE AND SYSTEM COMPRISING THE MICROPHONE DEVICE

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/684,925

(22) Filed: Nov. 15, 2019

(65) Prior Publication Data

US 2020/0162805 A1    May 21, 2020

Related U.S. Application Data

(60) Provisional application No. 62/801,931, filed on Feb. 6, 2019, provisional application No. 62/768,180, filed on Nov. 16, 2018.

(30) Foreign Application Priority Data

Mar. 20, 2019 (GB) .................................... 1903809

(51) Int. Cl.
*H04R 1/08* (2006.01)
*H04R 3/04* (2006.01)
*G10L 25/78* (2013.01)
*H03M 1/12* (2006.01)
*G10L 17/00* (2013.01)

(52) U.S. Cl.
CPC .................. *H04R 1/08* (2013.01); *H04R 3/04* (2013.01); *G10L 17/00* (2013.01); *G10L 25/78* (2013.01); *H03M 1/12* (2013.01); *H04R 2410/03* (2013.01); *H04R 2410/07* (2013.01)

(58) Field of Classification Search
CPC . H04R 3/00; H04R 3/005; H04R 3/04; H04R 3/10; H04R 19/016; H04R 2410/03; H04R 2410/07; H03M 1/10; H03M 1/12; G10L 17/00; G10L 25/78
USPC ...................... 381/111, 113, 91, 92, 122, 123
See application file for complete search history.

(56) References Cited

U.S. PATENT DOCUMENTS 8,670,572 B2 *  3/2014  Shih ......................... H04R 3/00
                                                                 381/71.13
2006/0215856 A1 *  9/2006  Meyer ...................... H04R 3/00
                                                                 381/113

(Continued)

FOREIGN PATENT DOCUMENTS

CN    102340722 A    2/2012
EP    3113171 A1    1/2017

(Continued)

OTHER PUBLICATIONS

International Search Report and Written Opinion of the International Searching Authority, International Application No. PCT/GB2019/053184, dated Jan. 31, 2020.

(Continued)

*Primary Examiner* — Xu Mei
(74) *Attorney, Agent, or Firm* — Jackson Walker L.L.P.

(57) ABSTRACT

There is described a switchable microphone device which may be switched between a digital output mode and an analog output mode. There is further described a system for use of such a device, which allows for the switching between analog and digital computing modes.

36 Claims, 8 Drawing Sheets

(56) References Cited

U.S. PATENT DOCUMENTS

2010/0166228 A1* 7/2010 Steele .................. H04R 3/00
                                                  381/113
2016/0066113 A1* 3/2016 Elkhatib ............... G06F 1/3287
                                                  381/56
2017/0263268 A1* 9/2017 Rumberg ............... G10L 15/02

FOREIGN PATENT DOCUMENTS

| GB | 2536797 A | 9/2016 |
| JP | 2008148224 A | 6/2008 |
| WO | 2017194580 A1 | 11/2017 |
| WO | 2019005772 A1 | 1/2019 |

OTHER PUBLICATIONS

Combined Search and Examination Report under Sections 17 and 18(3), UKIPO, Application No. GB1903809.0, dated May 7, 2019.

* cited by examiner

# MICROPHONE DEVICE AND SYSTEM COMPRISING THE MICROPHONE DEVICE The present disclosure claims priority to United States Provisional Patent Application Ser. No. 62/768,180, filed on Nov. 16, 2018, U.S. Provisional Patent Application Ser. No. 62/801,931, filed on Feb. 6, 2019, and United Kingdom Patent Application No. 1903809.0, filed on Mar. 20, 2019, each of which is incorporated by reference herein in its entirety.

BACKGROUND

Embodiments of the present disclosure relate to switchable microphone device and a system incorporating the switchable microphone device.

Increasing numbers of electronic devices are now being provided with embedded microphones, including personal audio devices such as mobile phones, tablet computers, music players, etc., as well as so-called "smart devices", such as voice assistant devices or electronic devices having embedded voice-processing functionality, e.g. smart televisions, home music players, etc. Such electronic devices are often provided with always-on listening capability.

Particularly for portable battery-powered devices, there is a continued desire to reduce the overall power consumption of such devices, while simultaneously not significantly impacting on device performance.

It is an object of embodiments of the present disclosure to provide a microphone device and system which addresses the above.

SUMMARY

Accordingly, there is provided a switchable microphone device comprising:
an input to receive at least one input analog sensor signal indicative of sound pressure received by a transducer;
an analog-to-digital converter (ADC) to convert the input analog sensor signal to a converted digital signal; and
a controller to switch the device between:
 a digital output mode, where the switchable microphone device outputs a digital microphone output signal based on the converted digital signal; and
 an analog output mode, where the switchable microphone device outputs an analog microphone output signal based on the input analog sensor signal.

By allowing for the switching between analog and digital output modes, the switchable microphone device may be effectively used in systems having both analog and digital processing solutions. In addition, providing an analog output mode may allow for digital processing aspects of the device to be powered-down or made inactive, reducing the power consumption of the device itself.

In a preferred aspect, the device comprises a transducer which is configured to provide an input analog sensor signal indicative of sound pressure received by the transducer. In such an embodiment, it will be understood that the switchable microphone device may be provided as a single package, e.g. as a co-packaged microphone element, which may be integrated with a larger circuit system. In some embodiments, the device may be provided with multiple microphone transducers configured to provide a plurality of input analog sensor signals, wherein the multiple microphone transducers are optimised for a particular amplitude and/or frequency range of the received sound pressure.

The co-packaged element may be provided with the transducer and the switching elements on a common die, or with the transducer provided on a die separate to the switching elements within a common package.

Preferably, the device is arranged to receive a control signal, wherein the controller switches between the digital and analog output modes based on the received control signal.

In a preferred aspect, the controller is further configurable to switch the device to:
 a hybrid output mode, where the switchable microphone device outputs both the digital microphone output signal based on the converted digital signal, and the analog microphone output signal based on the input analog sensor signal.

By providing such a third output mode, the device may allow for both analog and digital output signals from the microphone, which may be used for downstream signal processing of both the analog and digital signals.

In some embodiments, it will be understood that the device may be configured to output the analog microphone output signal when the device is in the digital output mode.

Preferably, the device is arranged to receive a clock signal for the ADC, wherein the clock signal operates as the control signal to control the switching of the output modes of the device.

Using a clock signal as a control signal allows for total pin count for the device to be reduced.

In one aspect, the controller is arranged to monitor the received clock signal, wherein the controller switches the device to the analog output mode if the clock signal is retained at a high value or at a low value exceeding a threshold time period.

It will be understood that the threshold time period may be selected to be longer than a predefined cycle time or half cycle for the ADC. It will be understood that the predefined cycle time may allow for drift in the exact ADC cycle time, and/or allow for the ADC to be able to operate in different modes based on the supplied clock frequency.

The clock signal may be configured to be held low or held high by an external driver. Additionally or alternatively, the device may be provided with a pull-up or pull-down element as required, e.g. a resistor or similar load device, or a suitably-configured transistor e.g. a MOSFET, to force the clock signal to a high or low value in the event of the external clock signal being in a high-impedance state.

Preferably, the controller may be configured to switch the device to the digital output mode if the received clock signal is within an allowed frequency range.

The allowed frequency range may be a defined frequency range for ADC operation, which may be defined to allow for variations in ADC operating frequency, and/or drift in exact cycle frequency of the ADC.

Alternatively, the device may be provided with a control input separate to a clock input, where the control input controls the switching of the output modes of the device.

Preferably, the device further comprises amplifier circuitry to provide a buffered analog output signal based on the input analog sensor signal.

The amplifier circuitry may be used to ensure that an analog output from the microphone device is sufficient to meet the requirements of any off-device loads to receive the analog output signal. Additionally or alternatively, the use of such amplifier circuitry may buffer a relatively weak signal from the transducer for further processing.

In one aspect, the ADC is configured to convert the buffered analog output signal to the converted digital signal.

Alternatively, the ADC may be configured to convert the input analog sensor signal directly. Such an ADC may comprise a built-in buffer or amplifier.

In one aspect, the amplifier circuitry comprises one or more of the following:
an adjustable gain amplifier;
a signal compression function; or
an analog filtering module.

The amplifier circuitry can be configured to adjust the gain of the analog signal; to perform a compression of the analog signal, e.g. a logarithmic or standard compand function; or to perform a filtering of the analog signal, e.g. a high-pass, low-pass, or band-pass filtering of the signal.

Preferably, the device further comprises an output interface to provide a digital microphone output signal based on the converted digital signal.

Preferably, the device further comprises a digital signal processing module arranged to perform digital signal processing on the converted digital signal to provide a processed digital signal, and the digital microphone output signal may be based on the processed digital signal.

Examples of digital signal processing which may be performed in the microphone device may include:
noise reduction of the converted digital signal;
wind noise suppression of the converted digital signal;
filtering of the converted digital signal; and
data formatting of the digital signal.

Preferably, the device comprises:
a digital output interface to output the digital microphone output signal; and
an analog output interface to output the analog microphone output signal.

In one embodiment, the device comprises a common output pin, wherein the controller controls the driving of the common output pin by the digital output interface and the analog output interface.

By providing a common output pin, the device may be configured to have a lower pin count, which can provide advantages in space-saving and routing of external signals. The controller may be configured to switch between the digital output interface and the analog output interface being connected to the common output pin, or the controller may tri-state the output signals of the digital output interface and the analog output interface as appropriate.

In an alternative aspect, the digital output interface comprises a bus, such as a single-wire or multiple-line bus, for the provision of a parallel bus output, e.g. a SLIMbus® output or a SoundWire® interface. Such a system may be used as a multi-drop bus, wherein the digital output of the device may be provided to multiple downstream devices.

In such an embodiment, the analog output interface comprises at least one analog output pin, the at least one analog output pin separate from the multiple-line bus.

In addition, the provision of a separate analog output pin may allow for the operation of a hybrid output mode, where the switchable microphone device outputs both the digital microphone output signal based on the converted digital signal, and the analog microphone output signal based on the input analog sensor signal.

Preferably, the device comprises a plurality of digital signal paths for the input analog sensor signal to provide a converted digital signal having a high dynamic range, the digital signal paths each comprising amplifier circuitry and an ADC,
wherein the amplifier circuitry of the different paths is configured to provide different signal ranges of the input analog sensor signal, and wherein the outputs of the ADCs of the different paths are combined to provide a converted digital signal having a high dynamic range.

For example, the different digital paths may comprise a first, approximately unity-gain, path to provide an analog signal with a "regular" range of operation, and a second, reduced-gain, path to provide an analog signal having a higher range to accommodate analog signals which may saturate any amplifiers tuned for a "regular" range of operation.

In one aspect, the analog microphone output signal is based on a combined version of the outputs of the amplifier circuitry of the different paths.

Alternatively, the analog microphone output signal is based on one signal range of the input analog sensor signal. In such a configuration, the analog microphone output signal may be based on the analog signal in the "regular" path.

An example of a dual-path front-end configuration can be found in U.S. Pat. No. 6,271,780, the contents of which are incorporated by reference herein.

There is further provided a system comprising:
a switchable microphone device as described above; and
a processor configured to control switching of the microphone device between the digital output mode and the analog output mode, the processor arranged to control processing of the output of the microphone device.

The system may be provided as a battery-powered personal audio device such as a mobile phone, a tablet computer, a personal music player, etc. The system may also be provided as a "smart device", such as a voice assistant device, or an electronic device having embedded voice-processing functionality, e.g. smart televisions, home music players, etc. The processor may be provided as an applications processor (AP) or a central processing unit (CPU) of such a device. The processor may be arranged to receive the output of the switchable microphone device, or the processor may be configured to control the routing of the output of the switchable microphone device to additional processing modules of the system.

Preferably, the processor controls a clock signal provided to the microphone device to control the mode switching of the microphone device. Alternatively, the processor may control a control signal provided to the microphone device to control the mode switching of the microphone device.

Preferably, the system further comprises:
an analog signal processing module, the analog signal processing module arranged to receive an analog microphone output signal from the switchable microphone device; and
a digital signal processing module, the digital signal processing module arranged to receive a digital microphone output signal from the switchable microphone device.

The analog and digital signal processing modules are arranged to process audio received by a transducer. The analog signal processing module may comprise an analog machine learning system. Preferably, the analog signal processing module is configured for relatively low-power, always-on computing. The digital signal processing module may comprise a DSP or a digital machine learning system. Preferably, the digital signal processing module is configured for relatively high-performance, high-accuracy computing. It will be understood that the processing modules may be provided as part of the processor of the system, or may be provided as discrete processing units the operation of which may be controlled by the processor of the system.

Preferably, the processor is arranged to switch the system between:

an analog computing mode, wherein the microphone device is switched to the analog output mode to provide the analog microphone output signal to the analog signal processing module; and a digital computing mode, wherein the microphone device is switched to the digital output mode to provide the digital microphone output signal to the digital signal processing module.

In some embodiments, it will be understood that the microphone device may continue to output the analog microphone output signal when the microphone device is switched to the digital output mode.

Preferably, the system is further configured such that:

when in the analog computing mode, the processor is configured to maintain the digital signal processing module in an inactive or low-power state; and when in the digital computing mode, the processor is configured to maintain the analog signal processing module in an inactive or low-power state.

In a further embodiment, the processor is arranged to further switch the system to:

a hybrid computing mode, wherein the microphone device is switched to a hybrid output mode to provide the analog microphone output signal to the analog signal processing module, and to provide the digital microphone output signal to the digital signal processing module.

In such a hybrid computing mode, the analog and digital signal processing modules may operate in parallel, with the outputs of both modules fused or combined by the processor. While the digital signal processing module may be configured to provide relatively higher accuracy than the analog signal processing module, the analog signal processing module may be configured to provide a faster response time. In such a configuration, the fusion of the outputs of both the analog and digital signal processing modules may provide an improvement in performance of the overall system.

Alternatively, for embodiments where the microphone device continues to output the analog microphone output signal when the microphone device is switched to the digital output mode, the system is configured such that:

when in the analog computing mode, the processor is configured to maintain the digital signal processing module in an inactive or low-power state; and when in the digital computing mode, the processor is configured to activate both to maintain the analog signal processing module and the digital signal processing module.

Preferably, the processor switches the system from the analog computing mode to the digital computing mode based on one or more of the following:

a user input, such as a mechanical button press;

a voice activity detection module (VAD) indicating the presence of speech in received audio;

a voice keyword detection module (VKD) indicating the presence of a keyword or wake-word in received audio;

a speaker identification or verification module indicating the identity or authorisation of a speaker of the received audio; and a command recognition module arranged to recognise commands present in speech in the received audio.

The system may change between the different operational modes based on processing requirements. In a preferred aspect, the system operates in a relatively low-power, always-on mode utilising the analog computing mode until there is a requirement for a higher accuracy output which may request a transition to the digital computing mode. For always-on audio listening applications, e.g. for speaker identification or verification, or automatic speech recognition, the transition may be triggered as a result of the system detecting the presence of voice or speech in the received audio, or the presence of a spoken keyword or wake-word in the received audio. It will be understood that such a VAD or VKD output may be provided by the output of the analog signal processing module, which may operate in an always-on mode.

In a further aspect, the system may be triggered to transition from the analog to the digital computing mode based on the output of a speaker identification or verification process. In particular, the system may be configured to perform an always-on speaker identification or verification process on the received audio using the analog signal processing module, and wherein the system is transitioned to the digital computing mode if the analog signal processing module identifies or verifies a speaker in the received audio. In some aspect, the digital signal processing module may then be used to perform further speaker identification or verification on the received audio, and/or to perform speech or command recognition on the received audio.

Preferably, the processor switches the system from the digital computing mode to the analog computing mode based on one or more of the following:

a user input, e.g. an indication to power-down the system;

the processor determining that a session has ended; and a system time-out.

The processor may act to transition the system back to the analog computing mode from the digital computing mode based on any suitable parameters.

While the above-described features relate to a microphone device and the signals produced by microphone transducers, it will be understood that the same principles and features may be applied for alternative devices, having other types of transducers where it may be desired to provide switchable analog and digital output modes, for example optical transducers, capacitive transducers, force sensing transducers, inductive sensing transducers, proximity detection transducers, ultrasonic transducers.

Accordingly, there is provided a switchable transducer device comprising:

an input to receive an input analog sensor signal from a transducer;

an analog-to-digital converter (ADC) to convert the input analog sensor signal to a converted digital signal; and a controller to switch the device between:

a digital output mode, wherein the switchable transducer device outputs a digital output signal based on the converted digital signal; and an analog output mode, wherein the switchable transducer device outputs an analog output signal based on the input analog sensor signal.

There is further provided a system comprising:

a switchable transducer device as described above; and a processor configured to control switching of the transducer device between the digital output mode and the analog output mode, the processor arranged to control processing of the output of the transducer device.

Additionally or alternatively, it will further be understood that a system may be provided with an output of a microphone device different to the switchable microphone device described above.

Accordingly, there is further provided a system comprising:

at least one microphone device to provide a microphone signal indicative of sound pressure received by a transducer of the microphone;

an analog signal processing module, the analog signal processing module arranged to receive an analog microphone signal from a microphone device;

a digital signal processing module, the digital signal processing module arranged to receive a digital microphone signal from a microphone device; and a processor arranged to control switching of the system between:
- an analog computing mode, wherein the analog signal processing module is enabled and the digital signal processing module is maintained in a low-power or inactive state; and
- a digital computing mode, wherein the digital signal processing module is enabled and the analog signal processing module is maintained in a low-power or inactive state.

The analog and digital signal processing modules are arranged to process audio received by a microphone transducer.

The analog and digital signal processing modules may be configured to perform one or more of the following:
- a voice activity detection process (VAD) indicating the presence of speech in received audio;
- a voice keyword detection process (VKD) indicating the presence of a keyword or wake-word in received audio;
- a speaker identification or verification process indicating the identity or authorisation of a speaker of the received audio;
- a speech recognition process arranged to recognise speech in the received audio; and
- a command recognition process arranged to recognise commands present in speech in the received audio.

Preferably, the analog signal processing module comprises an analog machine learning system. Preferably, the analog signal processing module is configured for relatively low-power, always-on computing.

Preferably, the digital signal processing module comprises a digital machine learning system. Preferably, the digital signal processing module is configured for relatively high-performance, high-accuracy computing.

Preferably, the processor is arranged to further control switching of the system between:
- a hybrid computing mode, where both the analog signal processing module and the digital signal processing module are enabled.

In a further aspect, there is provided a system comprising:
a switchable microphone device as described above; and
a downstream processing unit coupled to the switchable microphone device so as to receive the analog microphone output signal,
wherein the downstream processing unit comprises a second analog to digital converter (ADC) operative to convert the received analog microphone output signal to a supplementary converted digital signal, wherein the second ADC has a higher bandwidth than the ADC of the switchable microphone device, such that a bandwidth of the supplementary converted digital signal is greater than a bandwidth of the digital microphone output signal output by the switchable microphone device, and
wherein the system is configured to enable the second ADC if the converted digital signal output by the ADC of the switchable microphone device is indicative that the input analog sensor signal contains particular audio content.

The system may further comprise a controller configured to receive the converted digital signal output by the ADC of the switchable microphone device and to enable the second ADC if the converted digital signal output by the ADC of the switchable microphone device is indicative that the input analog sensor signal contains particular audio content.

The downstream processing unit may be coupled to the switchable microphone device so as to receive the digital microphone output signal.

The downstream processing unit may further comprise a combiner to combine the digital microphone output signal and the supplementary converted digital signal to generate a full-bandwidth digital signal.

Alternatively, the second ADC may be configured such that a bandwidth of the second ADC encompasses a bandwidth of the ADC of the switchable microphone device, such that the bandwidth of the supplementary converted digital signal encompasses the bandwidth of the digital microphone output signal output by the switchable microphone device.

The particular audio content may comprise speech.

The particular audio content may comprise a trigger word or phrase.

The downstream processing unit may further comprise an analog signal buffer configured to store the analog microphone output signal received from the switchable microphone device over a predetermined period of time.

In a still further aspect, there is provided a switchable microphone device comprising:
an input to receive an input analog sensor signal indicative of sound pressure received by a transducer;
a first analog-to-digital converter (ADC) to convert the input analog sensor signal to a first converted digital signal;
a second ADC to convert the input analog sensor signal to a second converted digital signal, wherein the second ADC has a higher bandwidth than the first ADC such that a bandwidth of the second converted digital signal is greater than a bandwidth of the first converted digital signal,
wherein the switchable microphone device is configured to enable the second ADC if the first converted digital signal is indicative that the input analog sensor signal contains particular audio content.

The device may further comprise a controller configured to receive the first converted digital output signal and to enable the second ADC if the first converted digital signal is indicative that the input analog sensor signal contains particular audio content.

The device may further comprise a combiner to combine the first converted digital signal and the second converted digital signal to generate a full-bandwidth digital output signal.

The particular audio content may comprise speech.

Alternatively, the particular audio content may comprise a trigger word or phrase.

The device may further comprise at least one microphone transducer configured to provide the input analog sensor signal indicative of sound pressure received by the at least one microphone transducer.

The device may further comprise amplifier circuitry configured to output a buffered analog output signal based on the input analog sensor signal.

The device may further comprise an analog signal buffer configured to store the buffered analog output signal output by the amplifier circuitry over a predetermined period of time.

The first DAC may be provided in a digital signal path between the input and an output interface of the device.

The second DAC may be provided in an analog signal path between the input and an output interface of the device, wherein the analog signal path is configured to provide an analog output signal to the output interface when the second DAC is disabled.

In a further aspect, there is provided a system comprising:
a switchable microphone device a; and
a processor,
   wherein the processor is configured to receive the first converted digital signal and to issue a control signal to the switchable microphone device to enable the second ADC if the first converted digital signal is indicative that the input analog sensor signal contains particular audio content.

BRIEF DESCRIPTION OF THE DRAWINGS

Embodiments of the present disclosure will now be described, by way of example only, with reference to the accompanying drawings, in which.

DETAILED DESCRIPTION

Figure 1:
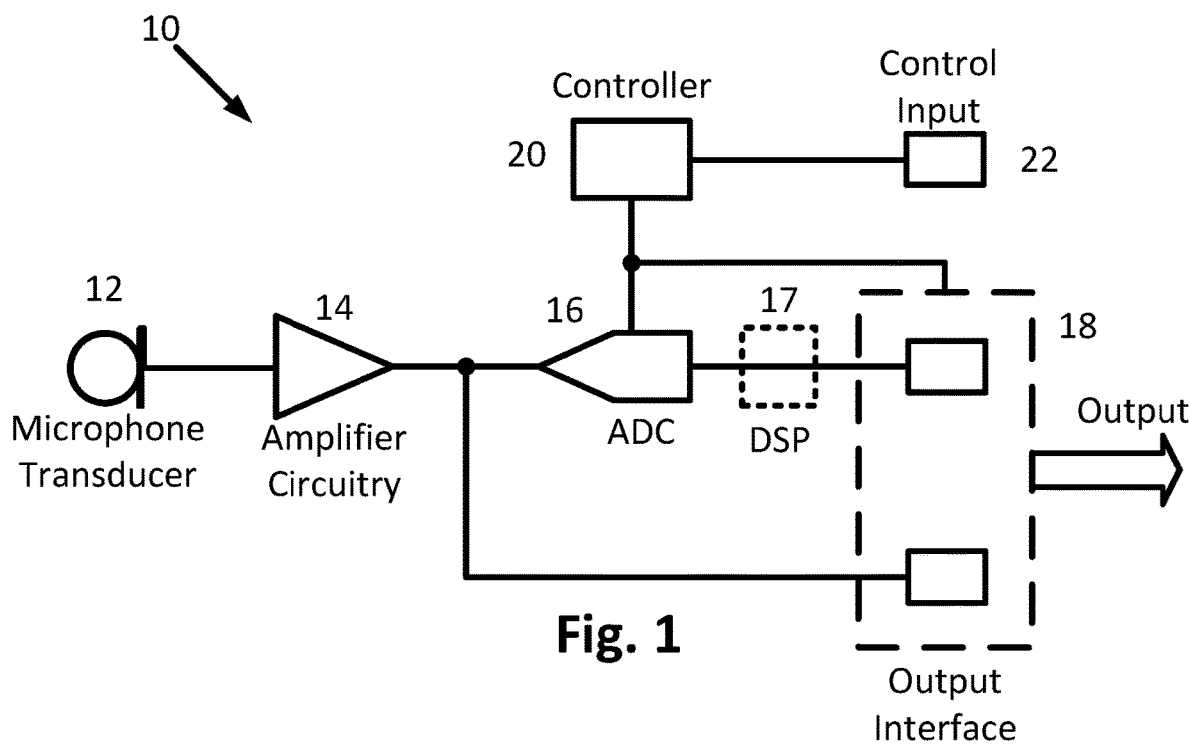
FIG. 1 is an illustration of a first embodiment of a microphone device according to the present disclosure.

With reference to FIG. 1, an embodiment of a switchable microphone device 10 according to the present disclosure is shown.

The device 10 is provided with a microphone transducer 12 which is arranged to provide an input analog sensor signal indicative of sound pressure received by the transducer 12. The analog sensor signal is provided to amplifier circuitry 14 which is configured to buffer, boost, and/or condition the received input analog signal. The buffered output of the amplifier circuitry 14 is provided to an analog-to-digital converter (ADC) 16, which converts the analog signal into a digital signal. It will be understood that the ADC 16 may be arranged to receive a clock signal to clock the operation of the ADC 16. Such a clock signal may be provided from an on-device oscillator, and/or may be received from or derived from an external clock signal.

The converted digital signal provided by the ADC 16 may comprise a multi-line or multi-wire output digital signal, or may comprise a modulated single-wire digital signal, e.g. a pulse-width-modulated (PWM) signal or pulse-density modulated (PDM) signal. The converted digital signal from the ADC 16 is provided to an output interface 18, which is configured to output a digital microphone output signal from the switchable microphone device 10 to downstream processing modules.

In addition to the above-described digital signal path which provides the converted digital signal, the switchable microphone device 10 further comprises an analog signal path, wherein the output of the amplifier circuitry 14 is also provided to the output interface 18, as an analog microphone output signal for transmission to downstream processing modules.

The switchable microphone device 10 further comprises a controller 20, which is operable to switch the device 10 between two modes:
   a digital output mode, where the device 10 outputs the digital microphone output signal based on the converted digital signal; and
   an analog output mode, where the device 10 outputs an analog microphone output signal based on the input analog sensor signal.

Analog computing systems may provide an advantage over digital systems, by virtue of their reduced power consumption. However, digital systems may be more easily constructed for relatively complicated and high-accuracy processes. In such a situation, it is recognised that there is a potential need for computing systems having both analog and digital computing systems, which accordingly require both analog and digital input signals. Such hybrid processing solutions may provide particular advantages in audio processing devices, where there may be a requirement to have an initial relatively low-power always-on listening state, which may power-gate a relatively high-power, high-accuracy processing state.

By providing a switchable microphone device, accordingly a single device can provide both the analog and digital signals for any such downstream processing modules.

Providing a single microphone device that can switch between a digital or an analog output may allow for a reduction in the overall power consumption of a system. For example, when the device is operating in one particular mode, then the components of the other signal path may be deactivated or maintained in a relatively low-power state to reduce the overall power consumption of the device. In addition, power consumption related to the driving of external or internal interconnections by signals having multiple edges may be reduced as required.

In addition, providing a single microphone device that can switch between a digital or an analog output provides a device where the output may be tailored as required for use in a larger system. For systems having a need for both analog and digital microphone outputs, only a single microphone transducer may be used, which potentially results in a reduction in the internal space required for a device, as well as the number of external microphone ports required for the device.

The device 10 is configured to receive an external control input 22, which is coupled with the controller 20. The control input 22 is used to control the switching of the device 10 between the analog and digital output modes. In one aspect, the control input 22 may be provided as a dedicated control pin or pins provided on the device 10, which instructs the controller 20 to switch between the output modes as required.

In an alternative aspect, the control input 22 may be provided as a clock signal used for the clocking of the ADC 16. In such an embodiment, the controller 20 may be configured to monitor the frequency of the clock signal control input, and to control the device switching based on the monitored frequency. For example, if the clock signal is within an allowable frequency range for normal operation of the ADC 16 (for example in the region of 1-3 MHz), the controller 20 may switch the device 10 to a digital output mode to output the converted digital signal from the ADC 16.

However, if the monitored frequency is outside of such a frequency range, for example if the clock signal is retained at a high value or at a low value exceeding a threshold time period, which may be equivalent to a predefined cycle time or half-cycle for the ADC, then the controller 20 may switch the device 10 to an analog output mode to output the analog microphone output signal, and to possibly also deactivate or place in relatively low-power performance mode the components of the digital signal path to conserve power.

The clock signal may be configured to be held low or held high by an external driver. Additionally or alternatively, the device 10 may be provided with a pull-up or pull-down element as required, e.g. a resistor or similar load device, or a suitably-configured transistor e.g. a MOSFET), to force the clock signal to a high or low value in the event of the external clock signal being in a high-impedance state.

By providing the control input 22 as the clock signal used for the clocking of the ADC 16, accordingly the total pin count and external connections for the device 10 may be reduced or minimised.

Figure 2:
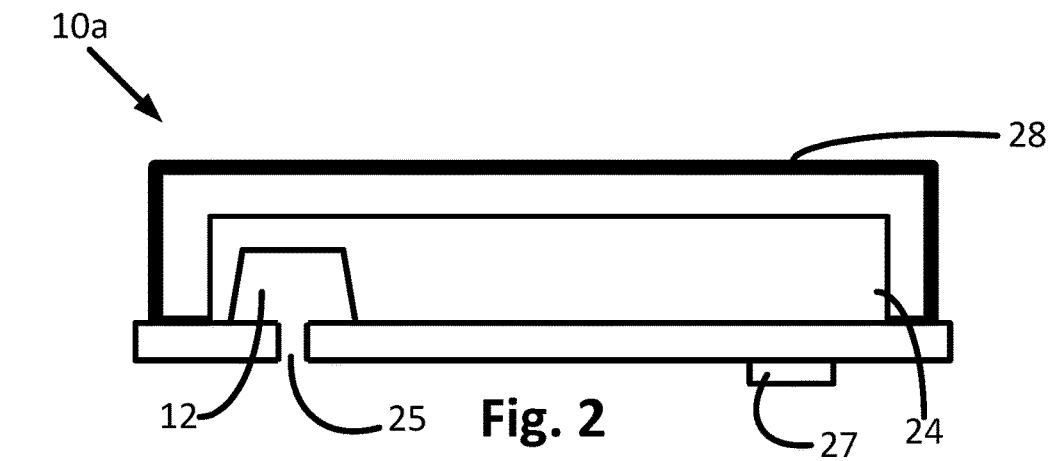
FIG. 2 is a cross-sectional view of a packaging configuration of the microphone device according to the present disclosure.
Figure 3:
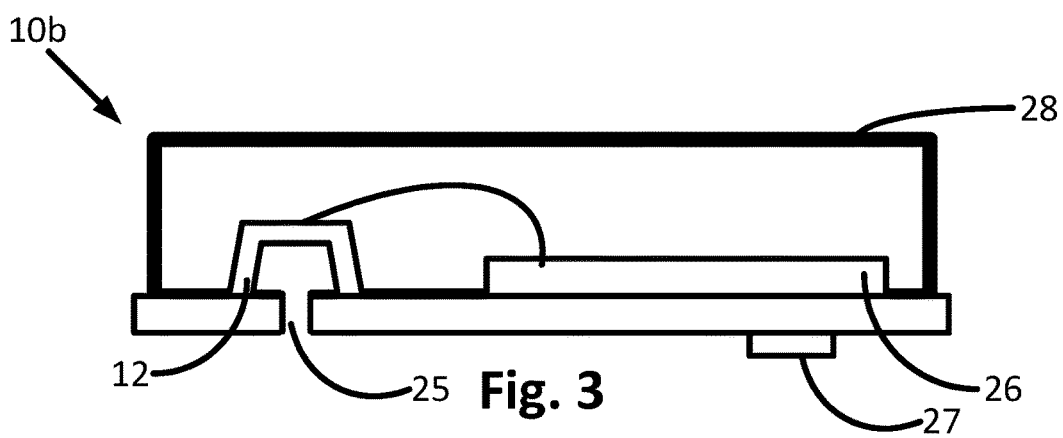
FIG. 3 is a cross-sectional view of an alternative packaging configuration of the microphone device according to the present disclosure.

With reference to FIGS. 2 and 3, it will be understood that the switching microphone device 10 may be provided as a single packaged element.

In FIG. 2, a first packaging embodiment of the switching microphone device 10a is shown, where the microphone transducer 12 is provided as part of a single integrated circuit die 24 with the rest of the components as indicated in FIG. 1.

In FIG. 3, a second packaging embodiment of the switching microphone device 10b is shown, where the microphone transducer 12 is provided as a separate element 12a connected with an integrated circuit die 26 comprising the remainder of the components as indicated in FIG. 1. In both embodiments shown in FIGS. 2 and 3, the components are provided within a common package 28 for use in a larger electronic system, and are provided with an acoustic port 25 for the microphone transducer 12, and an illustrative output pad or interface 27 which allows for the output of signals from the device 10a,10b. It will be understood that the output pad or interface 27 may comprise any suitable arrangements of solder pads or pins or similar, which may be used to connect the device 10a,10b to a larger circuit. In addition, it will be understood that the output pad or interface 27 may be located anywhere on the device 10a,10b to allow suitable access to the output signals.

In addition to the above-described analog and digital output modes, the controller 20 may be further arranged to allow for switching to a third operational mode, called a hybrid output mode, where the switchable microphone device 10 outputs both the digital microphone output signal and the analog microphone output signal. The use of such a hybrid output mode allows for both analog and digital output signals from the microphone device 10, which may be used for concurrent downstream signal processing of both analog and digital signals.

Figure 4:
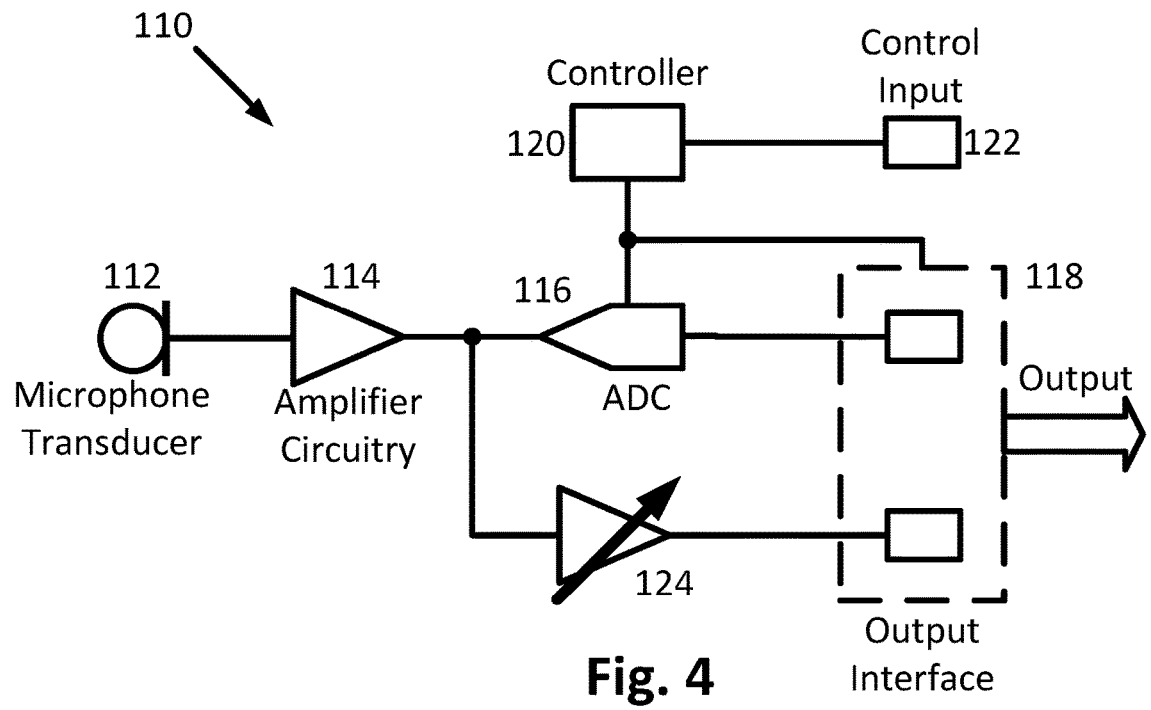
FIG. 4 is an illustration of a second embodiment of a microphone device according to the present disclosure.

It will be understood that other configurations of switchable microphone device may be used. With reference to FIG. 4, a second embodiment of switchable microphone device 110 is shown, with elements common to the embodiment of FIG. 1 reproduced with reference numerals increased by 100.

In the embodiment of FIG. 4, the analog signal path is provided with additional analog buffer circuitry 124, which is used to further buffer the analog output signal from the device 110, and to ensure that an analog output from the microphone device 110 is sufficient to meet the requirements of any off-device loads to receive the analog output signal. The additional analog buffer circuitry 124 may comprise an adjustable gain amplifier, which may be used to provide for an adjustable gain of the analog output signal if required. It will be understood that the gain of such an amplifier may be controlled by the integrated controller 120 and/or by an external control signal. It will be understood that the adjustable gain amplifier provided in 124 can be controlled such that the gain of the amplifier is dynamically adjusted to avoid clipping of the analog output signal.

In a further aspect, it will be understood that the analog buffer circuitry 124 may additionally or alternatively comprise a signal compression function, wherein the analog output signal has reduced gain at relatively large input signals to reduce dynamic range of the output signal. Such a compression function may be logarithmic or modelled on standard compand (compress-expand) functions such as A-law and mu-law. It will be understood that the operation of such a compression function may be controlled by the integrated controller 120 and/or by an external control signal.

In a further aspect, it will be understood that the analog buffer circuitry 124 may additionally or alternatively comprise an analog filtering module, wherein the analog output signal can be filtered as required. Examples of such filtering can include high-pass filtering of the analog output signal to remove interferers such as contact noise and/or acoustic noise from the package; low-pass filtering to remove unnecessary ultrasonic sounds from the analog filtering module; and/or a combination of both high-pass and low-pass filtering.

Figure 5A:
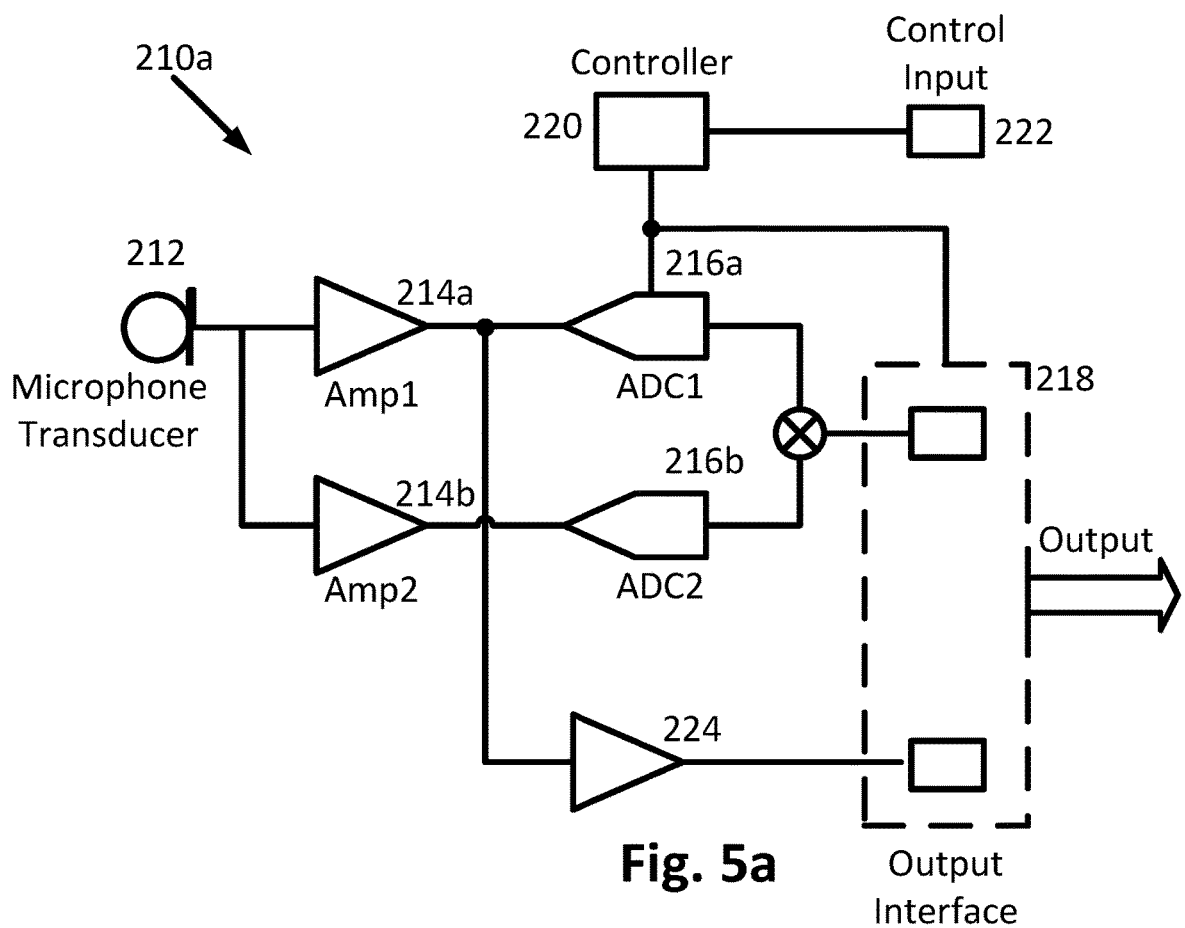
FIGS. 5(a)-(c) are illustrations of further embodiments of a microphone device according to the present disclosure, which allow for high dynamic range output signals.
Figure 5B:
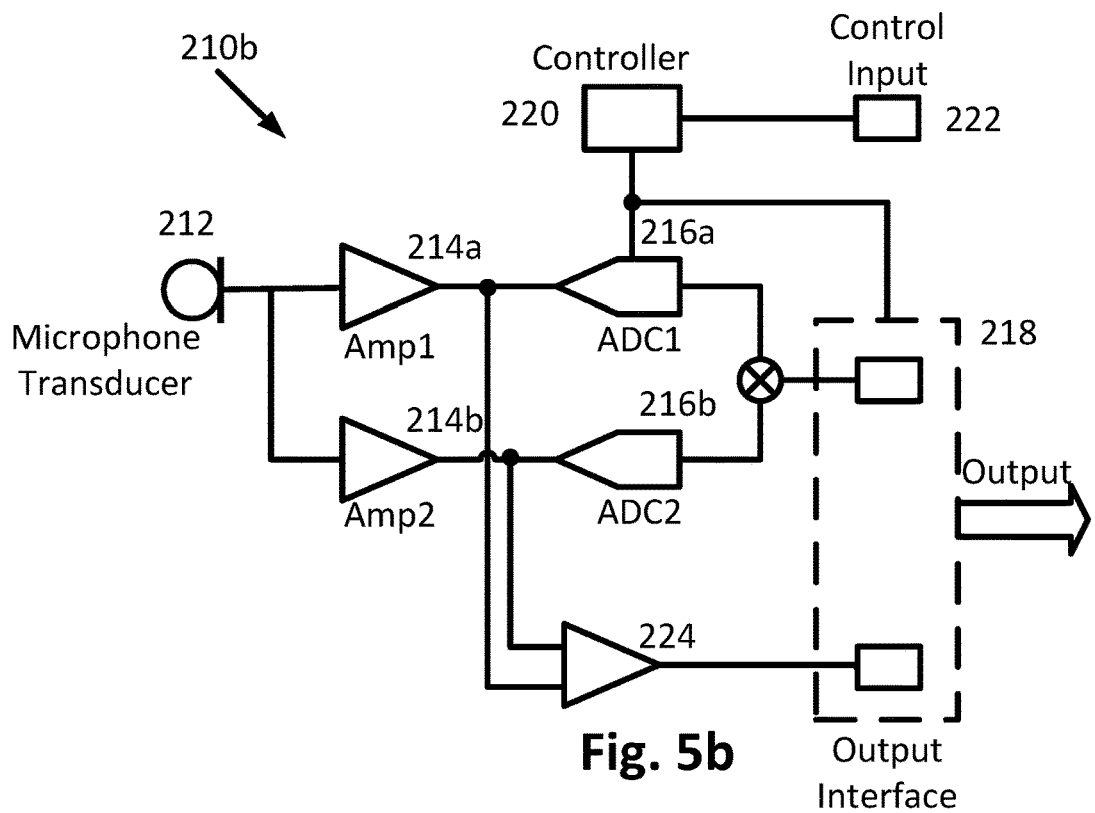
Figure 5C:
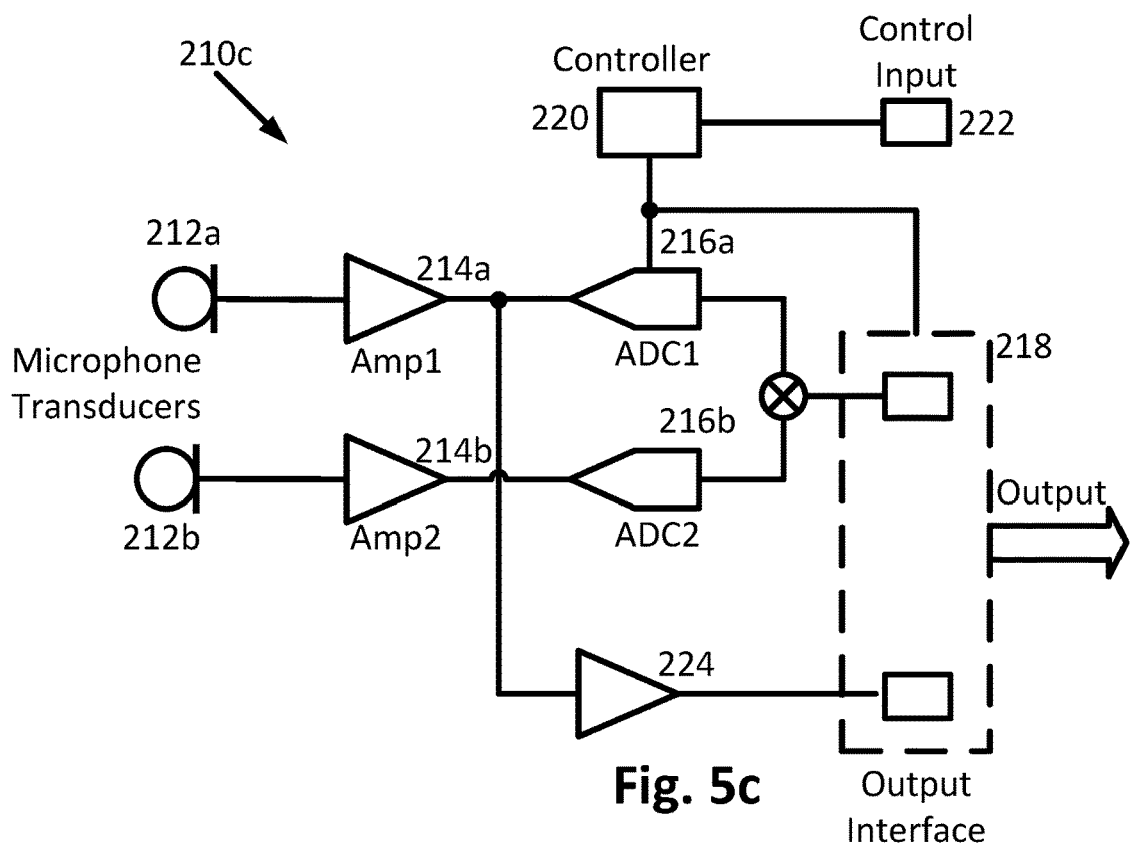

With reference to FIGS. 5(a)-(c), variations of a third embodiment of switchable microphone device 210a,210b, 210c are shown, with elements common to the embodiment of FIG. 1 reproduced with reference numerals increased by 200. The embodiments illustrated in FIGS. 5(a)-(c) are directed towards switchable microphone devices having high dynamic ranges.

In the embodiment of FIG. 5(a), the switchable microphone device 210a has a digital signal path which is configured to have a dual-path front-end, to allow for the conversion of high-dynamic range signals. In such a configuration, a first digital signal path is provided having first amplifier circuitry 214a and first ADC 216a, and a second digital signal path is provided having second amplifier circuitry 214b and second ADC 216b. The first amplifier circuitry 214a is configured to have approximately normal or unity gain to provide for conversion of relatively "normal" audio received by the transducer 212. However, high-amplitude audio may cause amplifier 214a or ADC 216a to clip or saturate. Accordingly, the second amplifier circuitry 214b is configured to have a reduced gain, e.g. −20 dB, such that any high-amplitude audio received by the transducer 212 does not over-saturate the second ADC 216b. The subsequent outputs of the first and second ADCs 216a,216b may be selected or mixed to provide the resultant converted digital output signal, which is provided to the output interface 218.

In this embodiment, the analog signal path is taken from the output of the first amplifier circuitry 214a of the first digital signal path, which may have additional analog buffer circuitry 224 similar to that of the embodiment of FIG. 4 to provide the analog microphone output signal.

Alternatively, the analog microphone output signal may be based on a combined version of the outputs of the first and second amplifier circuitry 214a,214b of the digital signal paths. With reference to the embodiment illustrated in FIG. 5(b), the switchable microphone device 210b is configured such that the output of the first amplifier circuitry 214a and the output of the second amplifier circuitry 214b are passed to the analog buffer circuitry 224, where the signals may be combined to provide a composite analog output for the interface 218.

It will be understood that the analog buffer circuitry 224 of FIG. 5(b) can be configured to implement an adjustable gain amplifier, signal compression function, and/or an analog filtering module as described above with reference to the embodiment of FIG. 5(a).

In an effort to provide improved dynamic range performance, a switchable microphone device may be provided with multiple microphone transducers wherein each microphone transducer is tailored for a specific portion of the desired dynamic range. With reference to the embodiment illustrated in FIG. 5(c), the switchable microphone device 210c comprises a first microphone transducer 212a configured or optimised to convert audio received within a first range of frequency and/or amplitude, and a second microphone transducer 212b configured or optimised to convert audio received within a second range of frequency and/or amplitude.

It will be understood that the embodiment of FIG. 5(c) may be further adapted such that the output of both the first amplifier circuitry 214a and second amplifier circuitry 214b is combined in the analog buffer circuitry 224 to provide a composite analog output for the interface 218. In addition, it will be understood that the analog buffer circuitry 224 of FIG. 5(c) can be configured to implement an adjustable gain amplifier, signal compression function, and/or an analog filtering module as described above with reference to the embodiment of FIG. 5(a).

In a further aspect of the present disclosure, it will be understood that the microphone device 10,110,210 may be provided with an integrated digital signal processing module (DSP) 17, which is indicated by a dashed outline/box in FIG. 1, but may also be utilised in the other embodiments of microphone device shown. The DSP 17 may be configured to perform some on-device signal processing of the converted digital signal before being output from the device. For example, the DSP 17 may be configured to perform one or more of the following:
  noise reduction of the converted digital signal;
  wind noise suppression of the converted digital signal;
  filtration of the converted digital signal; and data formatting of the digital signal.

As described above, the output interface may provide a multi-line or multi-wire output from the device package.

Figure 6:
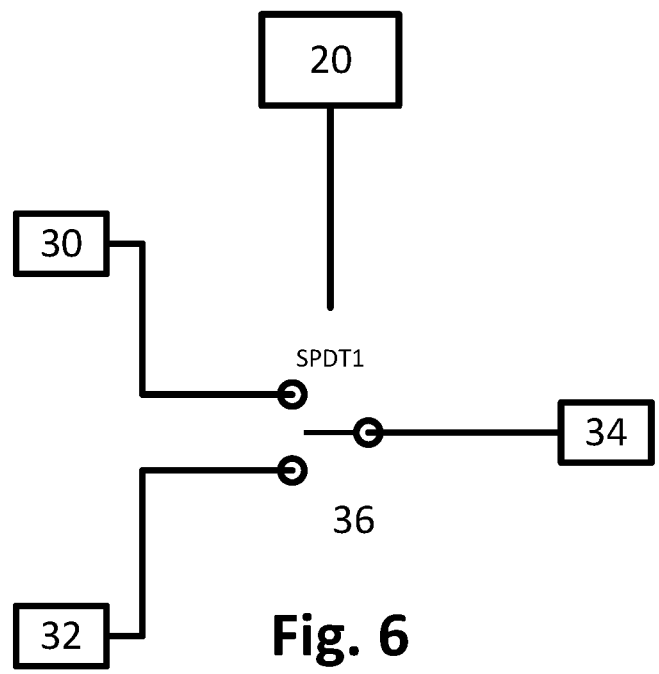
FIG. 6 is an illustration of a first configuration of an output interface for the microphone device according to the present disclosure.

Alternatively, the output interface 18,118,218 may provide a single output pad or pin for the device package which may be switched between an analog or a digital output. An example of a first configuration of such output interface is provided in FIG. 6. In FIG. 6, the output interface 18 comprises a digital signal node 30 coupled to the output of the digital signal path of the device, and an analog signal node 32 coupled to the output of the analog signal path of the device. In addition, the output interface comprises the output pad 34. A switch 36 is provided between the signal nodes 30,32 and the output pad 34, to selectively couple the respective digital signal node 30 and analog signal node 32 with the output pad 34. Operation of the switch 36 is controlled by the device controller 20, which switches between the digital or analog signal node 30,32, based on whether the device 10 is in the digital output mode or the analog output mode. It will be understood that the switch 36 may be implemented as suitable transistors, e.g. MOSFETs.

Figure 7:
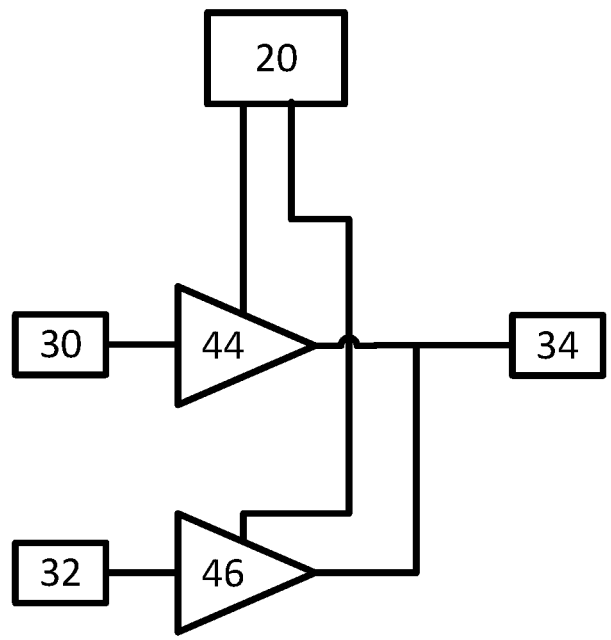
FIG. 7 is an illustration of a second configuration of an output interface for the microphone device according to the present disclosure.

An alternative configuration of the output interface 18 is provided in FIG. 7. In this embodiment, the interface comprises the digital signal node 30 and analog signal node 32 and the output pad or pin 34 of FIG. 6. The digital signal node 30 is connected to the output pad 34 through a first tri-state buffer 44. The analog signal node 32 is connected to the output pad 34 through a second tri-state buffer 46. The configuration of the respective first and second tri-state buffers 44,46 is controlled by the controller 20.

When the device 10 is in the digital output mode, the first tri-state buffer 44 is activated by the controller 20 to allow the digital output signal to pass through to the output pad 34. At the same time, the second tri-state buffer 46 is disabled by the controller 20, providing a high-impedance output of the buffer 46.

Similarly, when the device 10 is in the analog output mode, the first tri-state buffer 44 is deactivated by the controller 20 to place the buffer output in high-impedance mode, while the second tri-state buffer 46 is activated to pass the analog output signal to the output pad 34.

It will be understood that the output pad 34 may comprise any suitable solder pad or pin which may be provided on the device to allow output of signals from the device.

Figure 8:
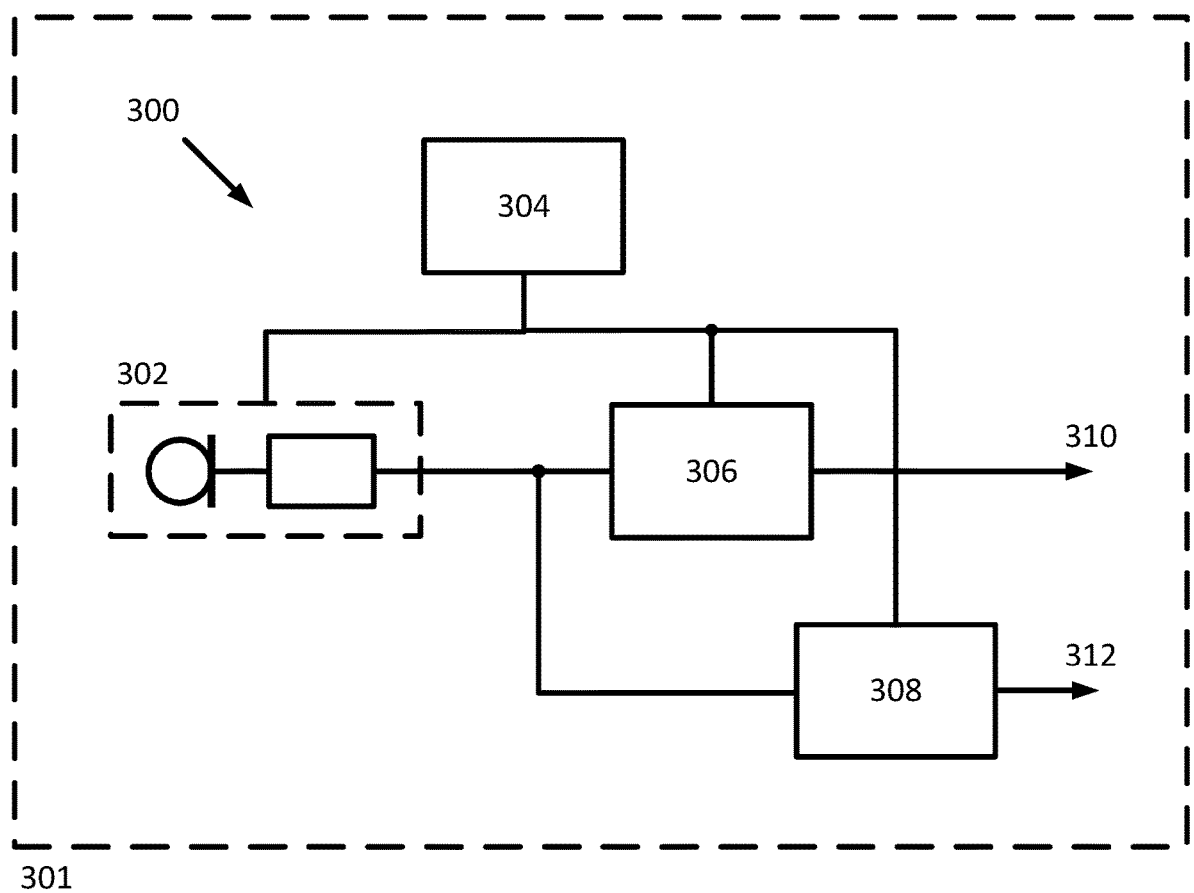
FIG. 8 is an illustration of a system incorporating a microphone device according to an aspect of the present disclosure.

The switchable microphone device 10,110,210 is preferably provided as part of a larger processing system. With reference to FIG. 8, an example implementation of such a system 300 is shown. It will be understood that the system 300 may be provided as part of a larger electronic device 301, e.g. a portable electronic device such as a mobile phone, a tablet computer, personal music player, or a smart device, such as a voice assistant device, or an electronic device having embedded voice-processing functionality, e.g. a smart television, a home music player or other home appliance.

A switchable microphone device 302 as described above is shown in FIG. 8, which is arranged to provide an analog and/or a digital microphone output signal. The switchable microphone device 302 is coupled with a processor unit 304, which may comprise an applications processor (AP) or central processing unit (CPU) for an electronic device. The processor 304 is arranged to control the switching of the microphone device 302 between the available output modes of the device 302, either by controlling the frequency of a clock signal provided to the device 302 or by controlling a dedicated control signal provided to the device 302.

The system 300 further comprises an analog signal processing module 306 and a digital signal processing module 308. It is recognised that as an analog computing module can be relatively easily configured and optimised for relatively low-power, always-on computing, and as a digital computing module can be relatively easily designed for relatively high-performance, high-accuracy computing, the provision of a hybrid analog/digital computing system can provide considerable advantages over prior art systems having only either an analog or a digital computing system. Preferably, the analog signal processing module 306 comprises an analog machine learning system, and preferably the digital signal processing module 308 comprises a DSP or a digital machine learning system. Accordingly, the processor 304 is configured to control the operation of the analog signal processing module 306 and the digital signal processing module 308. In particular, the processor 304 is arranged to switch the system 300 between:

- an analog computing mode, wherein the microphone device 302 is switched to the analog output mode to provide the analog microphone output signal to the analog signal processing module 306; and
- a digital computing mode, wherein the microphone device 302 is switched to the digital output mode to provide the digital microphone output signal to the digital signal processing module 308.

The processor 304 is further configured such that:
- when in the analog computing mode, the processor 304 maintains the digital signal processing module 308 in an inactive or low-power state; and
- when in the digital computing mode, the processor 304 maintains the analog signal processing module 306 in an inactive or low-power state.

Alternatively, the processor 304 may be configured to allow the analog signal processing module 306 to remain active when in the digital computing mode, to allow for processing of an analog output signal from the device 302, if the device 302 is configured to output the analog microphone output signal when in the digital output mode.

The processor 304 may switch the system 300 to the analog computing mode when the device 301 is to be provided in a relatively low-power mode, e.g. in a standby or always-on-listening mode, which allows for the analog signal processing module 306 to process the audio received by the microphone device 302.

The processing performed by the analog signal processing module 306 may be selected from one or more of the following:
- a voice activity detection process (VAD) indicating the presence of speech in received audio;
- a voice keyword detection process (VKD) indicating the presence of a keyword or wake-word in received audio;
- a speaker identification or verification process indicating the identity or authorisation of a speaker of the received audio; and
- a command recognition process arranged to recognise commands present in speech in the received audio.

Once the analog signal processing module 306 detects that some activity has occurred that may require additional processing power, e.g. the module 306 provides a positive indication for one of the above-listed process, then the module 306 may notify the processor 304 accordingly, and/or provide the output 310 of the analog signal processing module 306 to other downstream processing modules.

The processor 304 may then switch the system 300 to the digital computing mode, thereby instructing the microphone device 302 to provide a digital output signal and initialising or waking the digital signal processing module 308. The processor may also instruct the analog signal processing module 306 to transition to a low-power or inactive state when the system is in the digital computing mode. The digital signal processing module 308 may then perform digital system processing of the received audio, which may comprise a "second-pass" of the operations listed above, and/or any further or additional signal processing of the received audio. The digital signal processing module 308 may then notify the processor 304 of any outputs, and/or provide the output 312 of the digital signal processing module 308 to other downstream processing modules.

Additionally or alternatively, the processor 304 may be configured to transition to the digital computing mode based on any other input, e.g. an external user input indicating that the device 301 is to change from an inactive to an active state, or an indication that the device 301 is operating on mains power or with a relatively high level of battery power.

The processor 304 may be configured to switch the system 300 back to the analog computing mode, i.e. instructing the microphone device 302 to provide an analog output signal, while initialising or waking the analog signal processing module 306 and/or instructing the digital signal processing module 308 to transition to a low-power or inactive state. The transition to the analog computing mode may be triggered by any suitable input, e.g. a user input such as an indication to power-down the system 301; the processor 304 determining that a user interaction session has ended or that a session has timed-out; or a relatively low level of battery power for the device 301.

By providing a system that can switch between analog and digital computing modes, a device can be provided with the reduced power consumption of an analog-computing-based always-on listening mode and the high-accuracy processing of a digital-computing-based mode when required.

In a further aspect, the processor 304 may allow for the switching of the system to a hybrid computing mode, where the microphone device 302 is switched to a hybrid output mode to simultaneously provide the analog microphone output signal to the analog signal processing module 306, and to provide the digital microphone output signal to the digital signal processing module 308. The use of a hybrid processing module may allow for the analog and digital modules 306,308 to operate in parallel. The outputs 310,312 of the modules may then be fused or combined to provide improved accuracy.

In the embodiment of FIG. 8, the analog and digital modules 306,308 are connected to the same pin or bus output of the switchable microphone device 302. It will further be understood that, as described above, the switchable microphone device 302 may be provided with separate analog and digital outputs, wherein the analog signal processing module 306 is connected to an analog output of device 302 and the digital signal processing module 308 is connected to a digital output of device 302.

In the embodiment of FIG. 8, the processor 304 is shown as a separate element to the analog and digital modules 306,308, e.g. as separate integrated circuit devices. Alternatively, it will be understood that one or more of the modules 306,308 may be provided integrally as part of the processor unit 304.

In an alternative aspect, it will be understood that the system of FIG. 8 may be provided with analog and digital microphone output signals from alternative microphone devices, e.g. from a dedicated analog microphone and a dedicated digital microphone, wherein the dedicated analog microphone may be powered-down or made inactive during a digital computing mode, and wherein the dedicated digital microphone may be powered-down or made inactive during an analog computing mode.

The switchable microphone device 10/110/210 described above typically produces an output digital signal of relatively limited bandwidth at the output interface 18, due to limitations of the ADC 16. For example, if the ADC 16 receives a clock signal at a frequency of 768 kHz (which clock signal frequency may be selected based on an audio signal bandwidth of 16 kHz and a 48$x$ oversampling rate), the usable bandwidth of the converted digital signal output by the ADC 16 may be approximately 8 kHz. This usable signal bandwidth is sufficient for applications requiring limited signal bandwidth such as detecting speech, but is not sufficient for detecting signals of higher bandwidth.

In some applications it may be desirable to be able to detect and process signals of higher bandwidth. For example, in some applications signal content at ultrasonic signal frequencies may contain useful information.

For example, voice assistants or voice biometric systems can be vulnerable to so-called "spoofing" or "replay" attacks, in which a recording or other reproduction of an authorised user's voice is played to the voice assistant or voice biometric system by somebody other than the authorised user in an attempt to gain access to a voice interface of the voice assistant or voice biometric system.

It has also been found that it is possible to gain access to a voice interface using audio encoded in the ultrasonic frequency band (sometimes referred to as a "dolphin attack"). Because such attacks use ultrasonic frequencies, they cannot easily be detected by a human user.

Further, the performance of voice assistants and voice biometric systems can be adversely affected by ultrasonic interference. Such interference may arise, for example, from ultrasonic sources such as ultrasonic motion detectors.

Thus, it may be desirable to be able to detect and process signals having a bandwidth greater than the usable bandwidth of the digital microphone output signal output by the switchable microphone device, or the usable bandwidth of the converted digital signal output by the switchable microphone device 10/110/210, such as ultrasonic signals, in order to detect malicious attacks on voice assistants or voice biometric systems, or to detect interference that could degrade the performance of a voice assistant or voice biometric system.

One way to increase the usable bandwidth of converted digital signal output by the switchable microphone device 10/110/210 (and thus the usable bandwidth of the digital microphone output signal output by the switchable microphone device) would be to increase the frequency of the clock signal received by the ADC 16. However, this may not be possible, because the digital microphone output signal and/or the converted digital signal may need to be shared between multiple different devices or subsystems, which may not be able to accommodate dynamic adjustment of the frequency of the clock signal supplied to the ADC 16 and the consequential change in the bandwidth of the converted digital signal and the digital microphone output signal.

Figure 10:
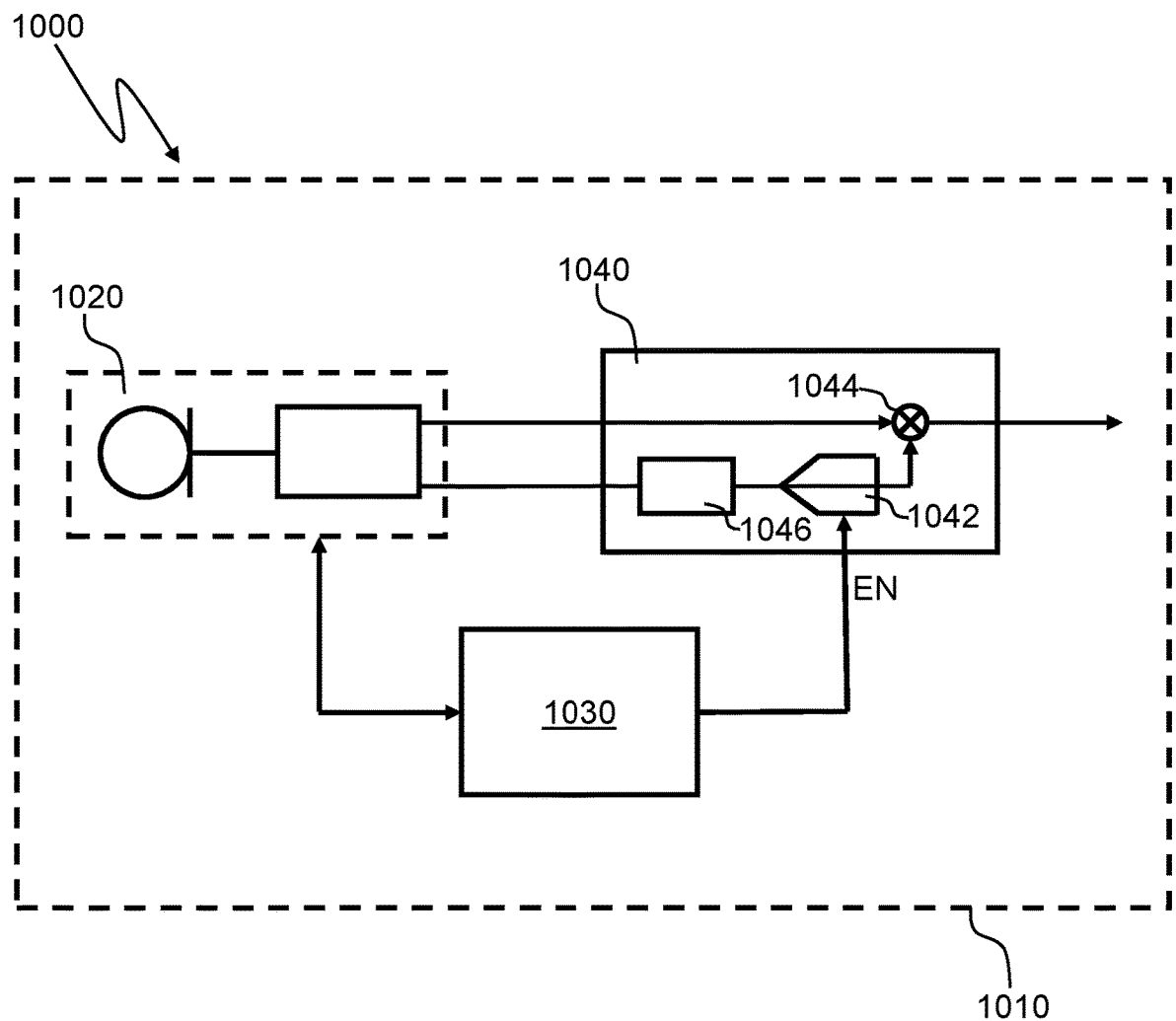
FIG. 10 is an illustration of a further system incorporating a microphone device according to an aspect of the present disclosure.

With reference to FIG. 10, a further example implementation of a system incorporating a switchable microphone device of the kind described above is shown generally at 1000. It will be understood that the system 1000 may be provided as part of a larger host electronic device 1010, e.g. a portable electronic device such as a mobile phone, a tablet computer, personal music player, or a smart device, such as a voice assistant device, or an electronic device having embedded voice-processing functionality, e.g. a smart television, home music player or other home appliance.

The switchable microphone device 1020 is coupled with a first processor unit or controller 1030, which may comprise, for example, a central processing unit (CPU) of a host electronic device. The first processor unit 1030 is arranged to control the switching of the microphone device 1020 between the available output modes of the device 1020, either by controlling the frequency of a clock signal provided to the device 1020 or by controlling a dedicated control signal provided to the device 1020.

The system 1000 also includes a second processor unit 1040 downstream of the switchable microphone device 1020. The second processor unit 1040 may be, for example, a codec, an applications processor of the host device 1010 or the like. Although for clarity the second processor unit 1040 is shown as being separate from the first processor unit 1030, it is to be appreciated that the functionality of the first and second processor units 1030, 1040 could be integrated in a single processor unit. For example, the first processor unit 1030 may also include the elements of the second processor unit 1040 described below, and thus may implement the functionality of the second processor unit 1040 described below.

The analog output of the interface unit of the switchable microphone device 1020 is coupled to an analog input of the second processing device 1040 such that the second processing device 1040 receives the analog microphone output signal output by the switchable microphone device 1020. The digital output of the interface unit of the switchable microphone device 1020 may be coupled to a digital input of the second processing device 1040 such that the second processing device 1040 receives the digital microphone output signal output by the switchable microphone device 1020.

The second processor unit 1040 includes an analog to digital converter (ADC) 1042 (which may be referred to as a second ADC, to distinguish it from the ADC 16 of the switchable microphone device). The second ADC 1042 is coupled to the analog input of the second processor unit 1040 so as to receive the analog signal output by the switchable microphone device. The second ADC 1042 is configured to provide a supplementary or second converted digital output signal with a higher usable bandwidth than the digital microphone output signal output by the switchable microphone device 1020. Thus, the ADC 1042 of the second processor unit 1040 has a higher bandwidth than the ADC 16 of the switchable microphone unit 1020, such that, for example, ultrasonic signal content in the analog signal output by the amplifier circuitry 14 of the switchable microphone unit 1020 is retained in the supplementary converted digital signal output by the ADC 1042. To this end, the ADC 1042 may receive a clock signal at a higher frequency than that of a clock signal that is supplied to the ADC 16 of the switchable microphone unit 1020. For example, in order for the second ADC 1042 to retain ultrasonic signal content at frequencies up to 40 kHz, the frequency of the clock signal supplied to the second ADC 1042 may be of the order of 3.84 MHz.

The ADC 1042 is normally disabled, but can be enabled when the supplementary (high-bandwidth) converted digital signal is desired. For example, an enable signal EN can be transmitted by the controller 1030 to the ADC 1042 to enable the ADC 1042 when the converted digital output signal output by the ADC 16 of the switchable microphone device 1020 (which may be referred to as the first converted digital output signal) or the digital microphone output signal is indicative that particular audio content such as speech or a trigger word or phrase (e.g. "hey Siri", "OK Google", "Alexa", etc.) intended to wake up a voice assistant of voice biometric system has been detected.

When the ADC 1042 is enabled, the analog signal output by the switchable microphone device 1020 is converted into a high-bandwidth supplementary converted digital output signal by the ADC 1042. This high-bandwidth supplementary converted digital output signal contains higher frequency signal content than the digital microphone output signal output by the switchable microphone device 1020. For example, the high-bandwidth supplementary converted digital output signal output by the ADC 1042 may include ultrasonic frequency signal content of the analog signal output by the switchable microphone device 1020 that is not retained in the digital microphone output signal.

In some examples the bandwidth of the high-bandwidth supplementary converted digital output signal is complementary to the bandwidth of the digital microphone output signal output by the switchable microphone device 1020 when the digital microphone device 1020 is operating in the hybrid mode described above, in which both a digital microphone output signal and an analog microphone output signal are output by the switchable microphone device. For example, if the digital microphone output signal contains frequencies in the range 0 Hz-8 kHz, then the supplementary converted digital output signal may contain frequencies in the range 8 kHz-40 kHz. The second processor unit 1040 may include a combiner or adder 1044 which is configured to combine the supplementary converted digital output signal with the digital microphone output signal so as to generate a full-bandwidth digital signal that can be output to one or more further downstream digital processing modules for further processing. The supplementary converted digital output signal may be filtered and/or otherwise processed, e.g. by a filter submodule and/or other processing submodule that may be provided as part of the second processor unit 1040 or external to the second processor unit 1040, prior to being combined with the digital microphone output signal in order match the signal gain of the supplementary converted digital output signal with that of the lower bandwidth digital microphone output signal to generate the full bandwidth digital signal.

In other examples, the bandwidth of the supplementary converted digital output signal may encompass the bandwidth of the digital microphone output signal when the digital microphone device 1020 is operating in the hybrid mode described above, (e.g. if the digital microphone output signal contains frequencies in the range 0 Hz-8 kHz, then the supplementary converted digital output signal may contain frequencies in the range 0 Hz-40 kHz), in which case combining the supplementary converted digital signal with the digital microphone output signal is not necessary, and the supplementary converted digital signal can be output to the further downstream digital processing module(s) as the full-bandwidth digital signal for further processing.

In other examples, where it is expected that the switchable microphone device 1020 will not operate in the hybrid mode described above, the bandwidth of the ADC 1042 of the second processor unit 1040 may be configured such that the bandwidth of the supplementary converted digital output signal encompasses the bandwidth of the digital microphone output signal (e.g. if the digital microphone output signal contains frequencies in the range 0 Hz-8 kHz, then the supplementary converted digital output signal may contain frequencies in the range 0 Hz-40 kHz), such that the second processor unit 1040 is able to output a full bandwidth digital signal for further processing by the downstream digital processing module(s) even when the switchable microphone device 1020 is not able to operate in the hybrid mode described above.

Processing of the full-bandwidth digital signal by the further downstream digital processing module(s) may identify that no ultrasonic frequency signal content is present in the full-bandwidth digital signal. This may be indicative of an attempted spoofing or replay attack, since ultrasonic frequency content would usually be expected in a genuine voice command such as a trigger word or phrase. Thus, the further downstream digital processing module(s) can take appropriate action such as issuing an alert or signal to prevent access to a voice interface of the host device 1010.

Processing of the full-bandwidth digital signal by the further downstream digital processing module(s) may identify that ultrasonic frequency signal content is present in the full-bandwidth digital signal. This may be indicative of an attempted dolphin attack in situations in which no voice audio signal has been detected. Thus, the downstream digital processing module(s) can take appropriate action such as issuing an alert or signal to prevent access to a voice interface of the host device 1010.

The presence of ultrasonic frequency signal content in the full-bandwidth digital signal may, additionally or alternatively, be indicative of the presence of ultrasonic interferers which could compromise the performance of a voice assistant or voice biometric system. For example, if ultrasonic frequency signal content at particular frequencies (e.g. 40 kHz) that are typically used by ultrasonic devices such as motion detectors such as 40 kHz is detected by the downstream digital processing module(s) as well as audio signal content such as speech, the downstream digital processing module(s) may take appropriate action such as flagging the audio signal content as being potentially affected by ultrasonic interference, so that additional processing to mitigate the possible interference can be performed when processing the audio content.

In some examples the second processor unit 1040 may include an analog signal buffer 1046 for storing the analog signal output by the switchable microphone device 1020 over a predetermined period of time. For example, the analog signal buffer 1046 may store the last 10 seconds' worth of the analog signal output by the switchable microphone device 1020, such that when the ADC 1042 is enabled by the first processor unit 1030 (in response to detection of a particular audio signal such as speech or a trigger word or phrase) the ADC 1042 can generate a high-bandwidth supplementary converted digital signal based on the analog signal stored in the buffer 1046. Thus, high-bandwidth signal content from the period immediately before the ADC 1042 was enabled can be processed, e.g. to identify possible attacks or interference as described above. The switchable microphone device 1020 may similarly generate a digital microphone output signal based on an analog signal stored over the predetermined period of time in a similar analog signal buffer that may be provided as part of the switchable microphone device 1020. This digital microphone output signal based on the buffered analog signal can be combined with the high-bandwidth supplementary converted digital signal generated by the ADC 1042 based on the buffered analog microphone output signal in order to generate a full-bandwidth digital signal for the period immediately before the ADC 1042 was enabled, which can be processed as described above e.g. to identify possible attacks or interference.

The system 1000 thus permits high-bandwidth signal content that cannot be retained in the digital microphone output signal to be retained and processed by downstream digital processing modules in order to detect attacks, interference and the like.

Figure 11:
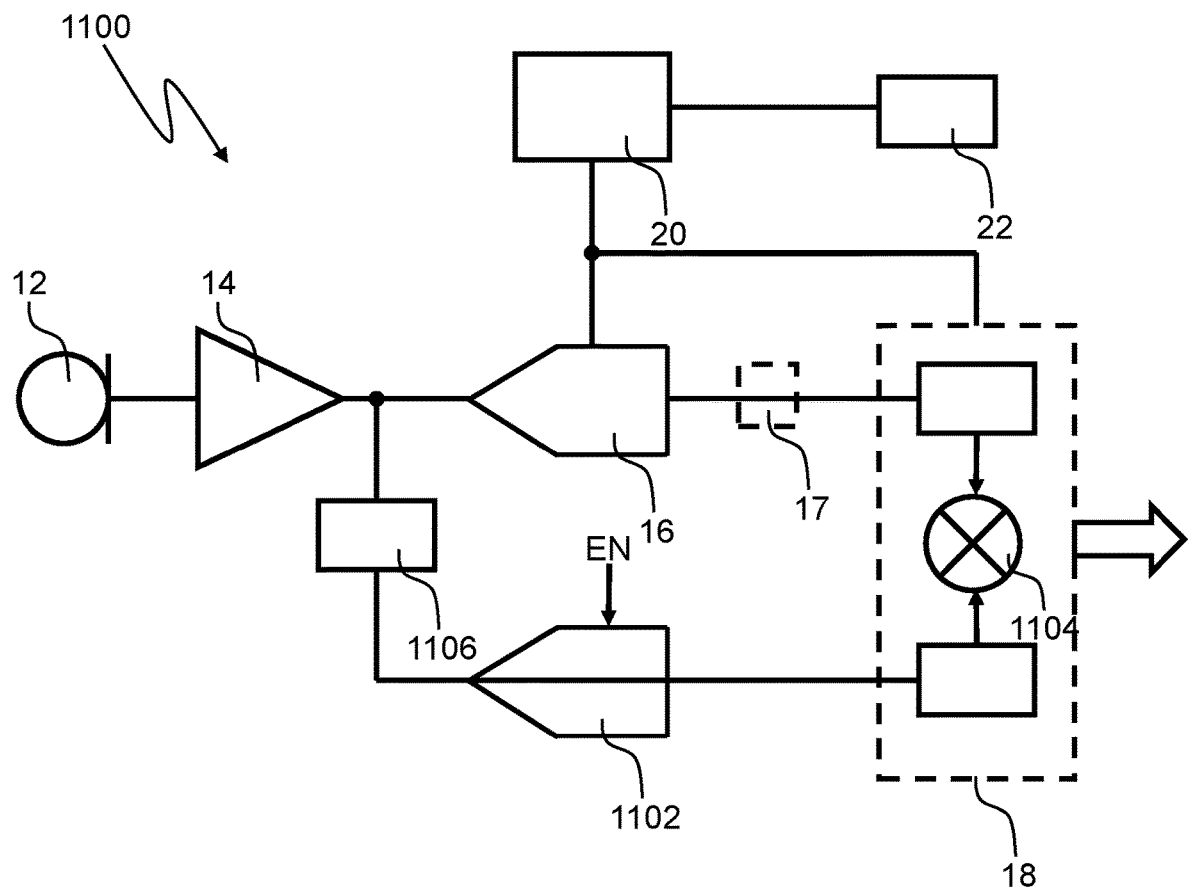
FIG. 11 is an illustration of a further embodiment of a microphone device according to the present disclosure.

With reference to FIG. 11, a further embodiment of a switchable microphone device 1100 according to the present disclosure is shown. The switchable microphone device 1100 is able to provide a converted digital output signal of a higher bandwidth than the converted digital signal output by the switchable microphone device 10/110/210.

The switchable microphone device 1100 is similar to the switchable microphone device 10 of FIG. 1, and so elements that are common to both the switchable microphone device 10 and the switchable microphone device 1100 are denoted by common reference numerals. Such common elements operate in the manner described above with reference to FIG. 1, and so will not be described in detail here.

As in the switchable microphone device 10, the switchable microphone device 1100 of FIG. 11 includes a first ADC 16, which converts an analog signal received from the amplifier circuitry 14 into a first converted digital output signal. The first ADC 16 in this example is a relatively low bandwidth ADC. For example, the first ADC 16 may receive a clock signal at a frequency of 768 kHz, giving rise to a usable bandwidth of the converted digital signal output by the first ADC 16 of approximately 8 kHz as discussed above.

The switchable microphone device 1100 also includes a second ADC 1102, which is provided in the analog signal path between the output of the amplifier circuitry 14 and the output interface 18. The second ADC 1102 is configured to provide a second converted digital output signal with a higher usable bandwidth than the first converted digital signal output by the ADC 16 (i.e. the second ADC 1102 has a higher bandwidth than the first ADC 16), such that, for example, ultrasonic signal content in the analog signal output by the amplifier circuitry 14 is retained in the second converted digital signal output by the second ADC 1002. To this end, the second ADC 1102 may receive a clock signal at a higher frequency than that of a clock signal that is supplied to the first ADC 16. For example, in order for the ADC 1102 to retain ultrasonic signal content at frequencies up to 40 kHz, the frequency of the clock signal supplied to the second ADC 1102 may be of the order of 3.84 MHz.

The second ADC 1102 is normally disabled, such that the analog signal path provides an analog signal to the output interface 18, as described above. The second ADC 1102 can be enabled when the second (high-bandwidth) converted digital signal is desired. For example, an enable signal EN can be transmitted by the controller 20 or by a processor of a host device incorporating the microphone device 1000 to the second ADC 1102 to enable the second ADC 1102 when the first converted digital output signal output by the first ADC 16 is indicative that particular audio content such as speech or a trigger word or phrase (e.g. "hey Siri", "OK Google", "Alexa", etc.) intended to wake up a voice assistant of voice biometric system has been detected.

When the second ADC 1102 is enabled, the analog signal output by the amplifier circuitry 14 is converted into a high-bandwidth second converted digital output signal by the second ADC 1002. This high-bandwidth second converted digital output signal contains higher frequency signal content than the first converted digital output signal output by the first ADC 16. For example, the high-bandwidth second converted digital output signal output by the second ADC 1102 may include ultrasonic frequency signal content of the analog signal output by the amplifier circuitry 14 that is not retained in the first converted digital output signal output by the first ADC 16.

The high-bandwidth second converted digital output signal is output by the second ADC 1102 to the output interface 18.

In some examples the bandwidth of the high-bandwidth second converted digital output signal is complementary to the bandwidth of the first converted digital output signal. For example, if the first converted digital output signal contains frequencies in the range 0 Hz-8 kHz, then the second converted digital output signal may contain frequencies in the range 8 kHz-40 kHz. The switchable microphone device 1000 may include a combiner or adder 1004 which is configured to combine the first and second converted digital output signals so as to generate a full-bandwidth digital signal that can be output to one or more downstream digital processing modules for further processing (after appropriate filtering and/or other processing of the second converted digital output signal if necessary by, e.g. a filter submodule and/or other processing submodule that may be provided as part of the switchable microphone device 1100, in order match the signal gain of the second converted digital output signal with that of the lower bandwidth first converted digital output signal to generate the full bandwidth digital signal).

Although the combined or adder 1104 is shown in the illustrated example as being provided as part of the output interface, those skilled in the art will appreciate that the combiner/adder 1104 could be provided at any other convenient location in the switchable microphone device 1100.

In other examples, the bandwidth of the second converted digital output signal may encompass the bandwidth of the first digital output signal (e.g. if the first converted digital output signal contains frequencies in the range 0 Hz-8 kHz, then the second converted digital output signal may contain frequencies in the range 0 Hz-40 kHz), in which case combining the first and second converted digital signals is not necessary, and the second converted digital signal can be output to the downstream digital processing module(s) as the full-bandwidth digital signal for further processing.

Processing of the full-bandwidth digital signal by the downstream digital processing module(s) may identify that no ultrasonic frequency signal content is present in the full-bandwidth digital signal. This may be indicative of an attempted spoofing or replay attack, since ultrasonic frequency content would usually be expected in a genuine voice command such as a trigger word or phrase. Thus, the downstream digital processing module(s) can take appropriate action such as issuing an alert or signal to prevent access to a voice interface of a host device incorporating the switchable microphone device 1100 and the downstream digital processing module(s).

Processing of the full-bandwidth digital signal by the downstream digital processing module(s) may identify that ultrasonic frequency signal content is present in the full-bandwidth digital signal. This may be indicative of an attempted dolphin attack in situations in which no voice audio signal has been detected. Thus, the downstream digital processing module(s) can take appropriate action such as issuing an alert or signal to prevent access to a voice interface of a host device incorporating the switchable microphone device 1100 and the downstream digital processing module(s).

The presence of ultrasonic frequency signal content in the full-bandwidth digital signal may, additionally or alternatively, be indicative of the presence of ultrasonic interferers which could compromise the performance of a voice assistant or voice biometric system. For example, if ultrasonic frequency signal content at particular frequencies (e.g. 40 kHz) that are typically used by ultrasonic devices such as motion detectors such as 40 kHz is detected by the downstream digital processing module(s) as well as audio signal content such as speech, the downstream digital processing module(s) may take appropriate action such as flagging the audio signal content as being potentially affected by ultrasonic interference, so that additional processing to mitigate the possible interference can be performed when processing the audio content.

In some examples the switchable microphone device 1100 may include an analog signal buffer 1106 for storing the analog signal output by the amplifier circuitry 14 over a predetermined period of time. For example, the analog buffer 1106 may store the last 10 seconds' worth of the analog signal output by the amplifier circuitry 14, such that when the second ADC 1102 is enabled by the controller 20 (in response to detection of a particular audio signal such as speech or a trigger word or phrase) the second ADC 1102 can generate a high-bandwidth second converted digital signal based on the analog signal stored in the buffer 1106, such that high-bandwidth signal content from the period immediately before the second ADC 1002 was enabled can be processed, e.g. to identify possible attacks or interference as described above. The first ADC 16 may similarly generate a first converted digital output signal based on the analog signal stored in the buffer 1006, which can be combined with the high-bandwidth second converted digital signal generated by the second ADC 1002 based on the buffered analog signal in order to generate a full-bandwidth digital signal for the period immediately before the second ADC 1102 was enabled, which can be processed as described above e.g. to identify possible attacks or interference.

The switchable microphone device 1100 thus permits high-bandwidth signal content that cannot be retained in the digital microphone output signal to be retained in the second digital output signal and made available for processing by downstream digital processing modules in order to detect attacks, interference and the like.

Figure 9:
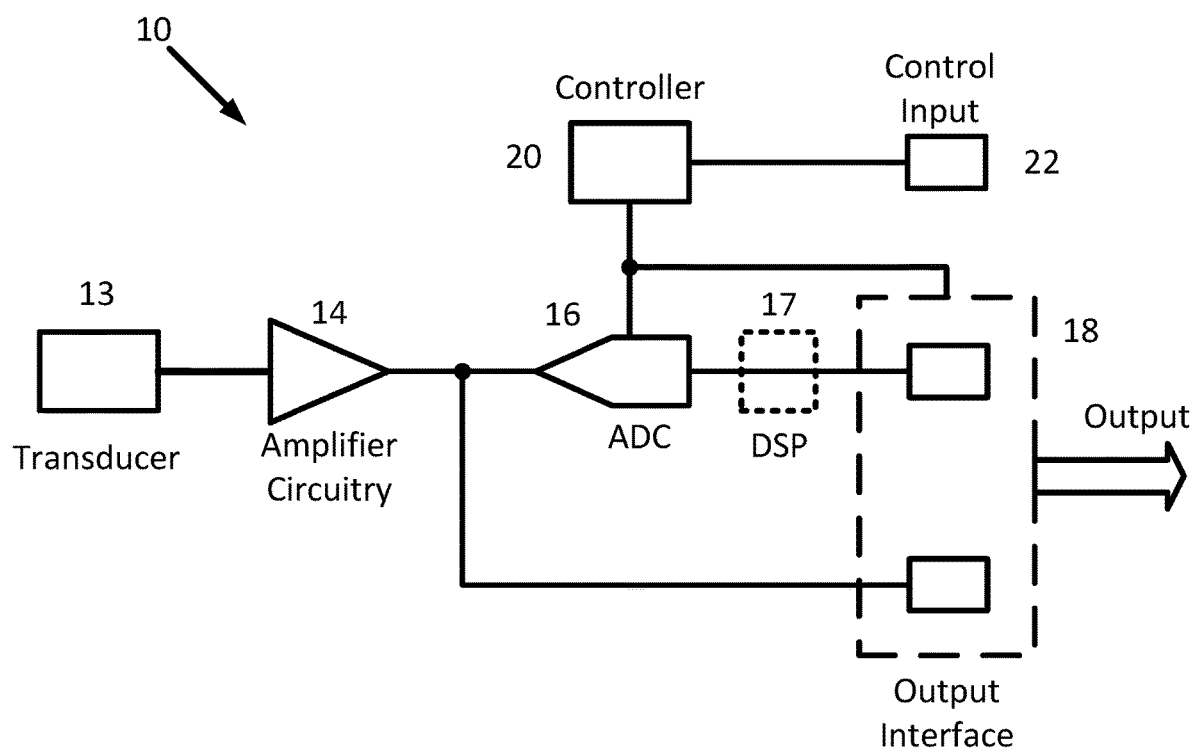
FIG. 9 is an illustration of a system incorporating a switchable transducer device according to a further aspect of the present disclosure.

While the above-described features relate to a microphone device and the signals produced by microphone transducers, it will be understood that the same principles and features may be applied for alternative devices, having other types of transducers where it may be desired to provide switchable analog and digital output modes, for example optical transducers, capacitive transducers, force sensing transducers, inductive sensing transducers, proximity detection transducers, ultrasonic transducers. With reference to FIG. 9, the embodiment of FIG. 1 is reproduced with a general transducer 13 replacing the microphone device 10 of FIG. 1. It will be understood that the above description of features for the embodiment of FIG. 1 may equally apply to the features of the embodiment of FIG. 9, mutatis mutandis.

The invention is not limited to the embodiments described herein, and may be modified or adapted without departing from the scope of the present invention.

The invention claimed is:

1. A switchable microphone device comprising:
   an input to receive an input analog sensor signal indicative of sound pressure received by a transducer;
   an analog-to-digital converter (ADC) to convert the input analog sensor signal to a converted digital signal; and
   a controller to switch the device between:
      a digital output mode, wherein the switchable microphone device outputs a digital microphone output signal based on the converted digital signal; and
      an analog output mode, wherein the switchable microphone device outputs an analog microphone output signal based on the input analog sensor signal, wherein the switchable microphone device outputs the analog microphone output signal when the device is in the digital output mode.

2. The device of claim 1, further comprising at least one microphone transducer configured to provide the input analog sensor signal indicative of sound pressure received by the at least one microphone transducer.

3. The device of claim 1, wherein the device is arranged to receive a control signal, wherein the controller switches between the digital and analog output modes based on the received control signal.

4. The device of claim 1, wherein the controller is further configured to switch the device to:
   a hybrid output mode, wherein the switchable microphone device outputs both the digital microphone output signal based on the converted digital signal, and the analog microphone output signal based on the input analog sensor signal.

5. The device of claim 1, wherein the device is arranged to receive a clock signal, wherein the clock signal operates as the control signal to control the switching of the output modes of the device.

6. The device of claim 5, wherein the controller is arranged to monitor the received clock signal, wherein the controller switches the device to the analog output mode if the clock signal is retained at a high value or at a low value exceeding a threshold time period.

7. The device of claim 5, wherein the controller is configured to switch the device to the digital output mode if the received clock signal is within an allowed frequency range.

8. The device of claim 1, wherein the device is provided with a control input, wherein the control input controls the switching of the output modes of the device.

9. The device of claim 1, wherein the device further comprises amplifier circuitry to provide a buffered analog output signal based on the input analog sensor signal.

10. The device of claim 9, wherein the amplifier circuitry comprises one or more of the following:
    an adjustable gain amplifier;
    a signal compression function; or
    an analog filtering module.

11. The device of claim 1, wherein the device further comprises an output interface to provide a digital microphone output signal based on the converted digital signal.

12. The device of claim 1, wherein the device further comprises a digital signal processing module arranged to perform digital signal processing on the converted digital signal to provide a processed digital signal, and wherein the digital microphone output signal is based on the processed digital signal.

13. The device of claim 1, wherein the device comprises:
    a digital output interface to output the digital microphone output signal; and
    an analog output interface to output the analog microphone output signal.

14. The device of claim 13, wherein the device comprises a common output pin, wherein the controller controls the driving of the common output pin by the digital output interface and the analog output interface.

15. The device of claim 13, wherein the digital output interface comprises a digital bus, such as a single-wire or multiple-line bus, and wherein the analog output interface comprises at least one analog output pin, and wherein the at least one analog output pin is separate from the digital bus.

16. The device of claim 1, wherein the device comprises a plurality of digital signal paths for the input analog sensor signal to provide a converted digital signal having a high dynamic range, the digital signal paths each comprising an amplifier circuitry and an ADC,
wherein the amplifier circuitry of the different paths is configured to provide different signal ranges of the input analog sensor signal, and wherein the outputs of the ADCs of the different paths are combined to provide a converted digital signal having a high dynamic range.

17. The device of claim 16, wherein the analog microphone output signal is based on a combined version of the outputs of the amplifier circuitry of the different paths.

18. The device of claim 16, wherein the analog microphone output signal is based on the output of the amplifier circuitry of one of the digital signal paths.

19. A system comprising:
a switchable microphone device as claimed in claim 1; and
a processor configured to control switching of the microphone device between the digital output mode and the analog output mode.

20. The system of claim 19, wherein the processor controls a clock signal provided to the microphone device to control the mode switching of the microphone device, or the processor controls a control signal provided to the microphone device to control the mode switching of the microphone device.

21. The system of claim 19, wherein the system further comprises:
an analog signal processing module, the analog signal processing module arranged to receive an analog microphone output signal from the switchable microphone device; and
a digital signal processing module, the digital signal processing module arranged to receive a digital microphone output signal from the switchable microphone device.

22. The system of claim 21, wherein the processor is arranged to switch the system between:
an analog computing mode, wherein the microphone device is switched to the analog output mode to provide the analog microphone output signal to the analog signal processing module; and
a digital computing mode, wherein the microphone device is switched to the digital output mode to provide the digital microphone output signal to the digital signal processing module.

23. The system of claim 22, wherein the system is further configured such that:
when in the analog computing mode, the processor is configured to maintain the digital signal processing module in an inactive or low-power state; and
when in the digital computing mode, the processor is configured to maintain the analog signal processing module in an inactive or low-power state.

24. The system of claim 22, wherein the switchable microphone device continues to output an analog microphone output signal when the switchable microphone device is switched to the digital output mode, the system is configured such that:
when in the analog computing mode, the processor is configured to maintain the digital signal processing module in an inactive or low-power state; and
when in the digital computing mode, the processor is configured to activate both to maintain the analog signal processing module and the digital signal processing module.

25. The system of claim 22, wherein the processor is arranged to further switch the system to:
a hybrid computing mode, wherein the microphone device is switched to a hybrid output mode to provide the analog microphone output signal to the analog signal processing module, and to provide the digital microphone output signal to the digital signal processing module.

26. The system of claim 22, wherein the processor switches the system from the analog computing mode to the digital computing mode based on one or more of the following:
a user input, such as a mechanical button press;
a voice activity detection module (VAD) indicating the presence of speech in received audio;
a voice keyword detection module (VKD) indicating the presence of a keyword or wake-word in received audio;
a speaker identification or verification module indicating the identity or authorisation of a speaker of the received audio;
a command recognition module arranged to recognise commands present in speech in the received audio.

27. The system of claim 22, wherein the processor switches the system from the digital computing mode to the analog computing mode based on one or more of the following:
a user input, e.g. an indication to power-down the system;
the processor determining that a session has ended; and
a system time-out.

28. An electronic device comprising the system of claim 22, the electronic device comprises a portable electronic device such as a mobile phone, a tablet computer, personal music player, or wherein the electronic device comprises a smart device, such as a voice assistant device, or an electronic device having embedded voice-processing functionality, such as a smart television or other home appliance, a home music player.

29. A system comprising:
at least one microphone device to provide a microphone signal indicative of sound pressure received by a transducer of the microphone;
an analog signal processing module, the analog signal processing module arranged to receive an analog microphone signal from a microphone device;
a digital signal processing module, the digital signal processing module arranged to receive a digital microphone signal from a microphone device; and
a processor arranged to control switching of the system between:
an analog computing mode, wherein the analog signal processing module is enabled and the digital signal processing module is maintained in a low-power or inactive state; and
a digital computing mode, wherein the digital signal processing module is enabled and the analog signal processing module remains in an active state.

30. The system of claim 29, wherein the analog and digital signal processing modules are arranged to process audio received by a microphone transducer.

31. The system of claim 29, wherein the analog and digital signal processing modules may be configured to perform one or more of the following:
- a voice activity detection process (VAD) indicating the presence of speech in received audio;
- a voice keyword detection process (VKD) indicating the presence of a keyword or wake-word in received audio;
- a speaker identification or verification process indicating the identity or authorisation of a speaker of the received audio;
- a speech recognition process arranged to recognise speech in the received audio; and
- a command recognition process arranged to recognise commands present in speech in the received audio.

32. The system of claim 29, wherein the analog signal processing module comprises an analog machine learning system, preferably wherein the analog signal processing module is configured for relatively low-power, always-on computing.

33. The system of claim 29, wherein the digital signal processing module comprises a digital machine learning system, preferably wherein the digital signal processing module is configured for relatively high-performance, high-accuracy computing.

34. The system of claim 29, wherein the processor is arranged to further control switching of the system between:
- a hybrid computing mode, wherein both the analog signal processing module and the digital signal processing module are enabled.

35. A switchable transducer device comprising:
- an input to receive an input analog sensor signal from a transducer;
- an analog-to-digital converter (ADC) to convert the input analog sensor signal to a converted digital signal; and
- a controller to switch the device between:
  - a digital output mode, wherein the switchable transducer device outputs a digital output signal based on the converted digital signal; and
  - an analog output mode, wherein the switchable transducer device outputs an analog output signal based on the input analog sensor signal,
- wherein the switchable transducer device outputs the analog sensor signal when the device is in the digital output mode.

36. A system comprising:
- a switchable transducer device as claimed in claim 35; and
- a processor configured to control switching of the transducer device between the digital output mode and the analog output mode, the processor arranged to control processing of the output of the transducer device.

* * * * *